US008975988B1

(12) United States Patent
Tsironis

(10) Patent No.: US 8,975,988 B1

(45) Date of Patent: Mar. 10, 2015

(54) IMPEDANCE TUNER USING DIELECTRICALLY FILLED AIRLINE

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 16 days.

(21) Appl. No.: 13/798,304

(22) Filed: Mar. 13, 2013

(51) Int. Cl.
*H03H 7/40* (2006.01)
*H03H 7/38* (2006.01)

(52) U.S. Cl.
CPC .. *H03H 7/40* (2013.01); *H03H 7/38* (2013.01)
USPC .......................................... 333/263; 333/17.3

(58) Field of Classification Search
USPC ..................................... 333/32, 33, 263, 17.3
See application file for complete search history.

(56) References Cited

U.S. PATENT DOCUMENTS

| | | | | |
|---|---|---|---|---|
| 6,674,293 | B1 | 1/2004 | Tsironis | |
| 7,135,941 | B1 | 11/2006 | Tsironis | |
| 7,646,267 | B1 * | 1/2010 | Tsironis | 333/263 |

* cited by examiner

*Primary Examiner* — Stephen E Jones

(57) ABSTRACT

Mechanically short single and multi-carriage impedance tuners use a dielectrically filled slabline. The dielectric filling reduces the overall tuner length by a factor of $1/\sqrt{\epsilon_r}$. The increase in loss, and associated reduction in reflection factor, is partly compensated by the shorter size and travel of the probes. A typical length reduction factor is 40%. Using dielectric low loss oil also reduces the electric field between probe and center conductor and increases Corona threshold; lubrication of sliding contact between probe and slabline walls and cooling of the center conductor are additional benefits. The method is most effective for wideband tuners with lowest frequency of operation between 100 and 200 MHz and harmonic tuners with lowest frequency between 200 and 400 MHz.

8 Claims, 12 Drawing Sheets

Slabline section filled with dielectric liquid

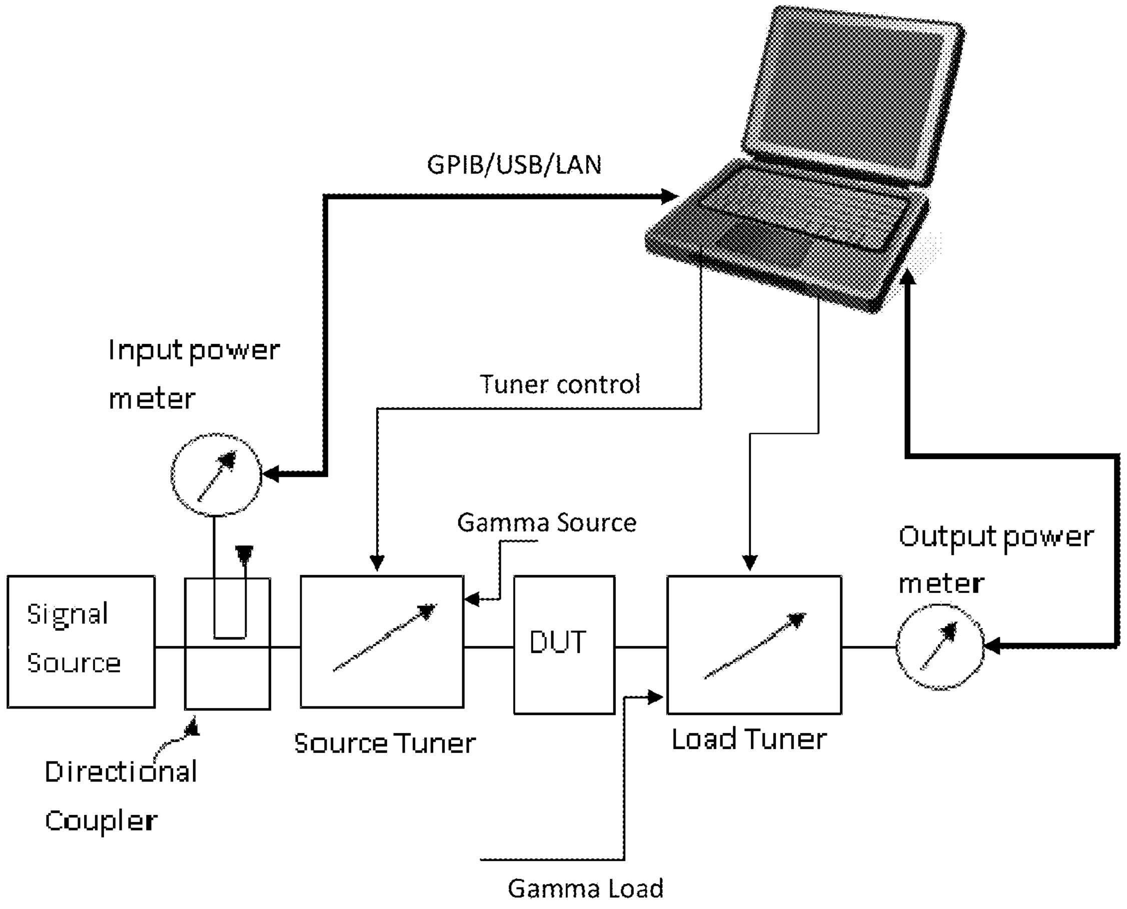
Figure1: (prior art) Load Pull measurement setup a)
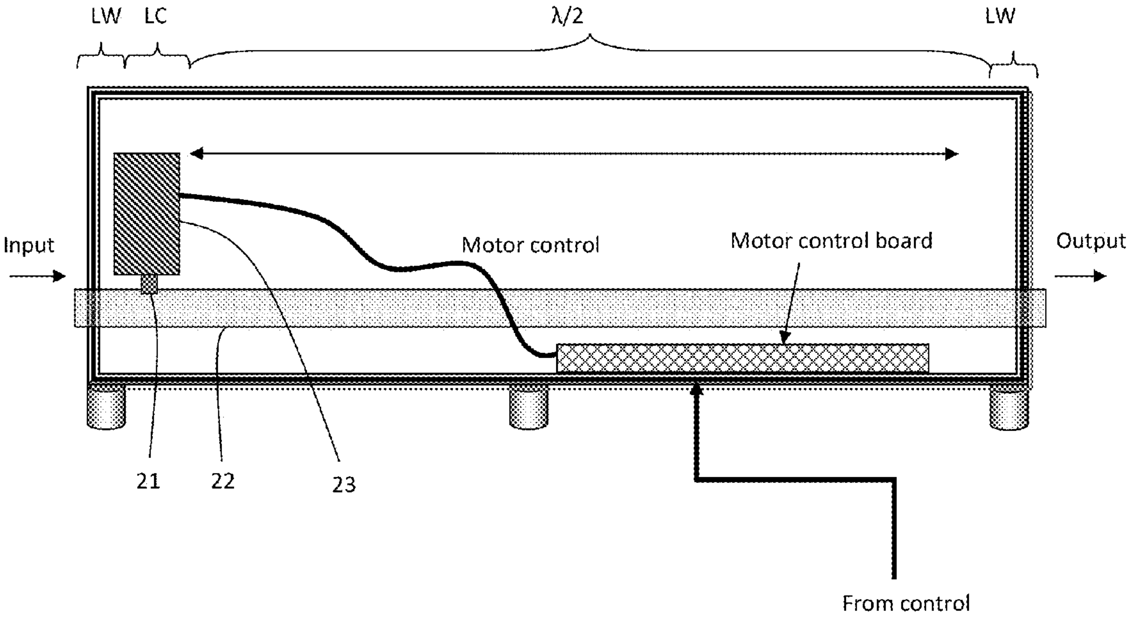
b)
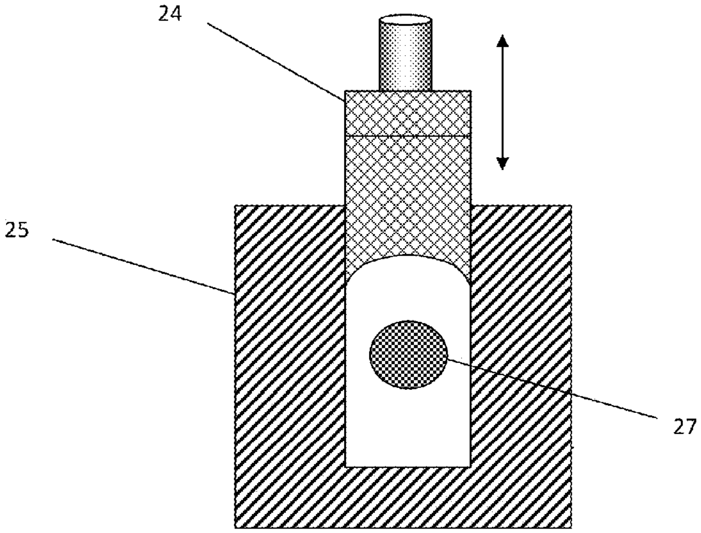
Figure 2 (prior art) a) Total length of a tuner, LC=carriage, LW=wall; b) Cross section of slabline and capacitive probe

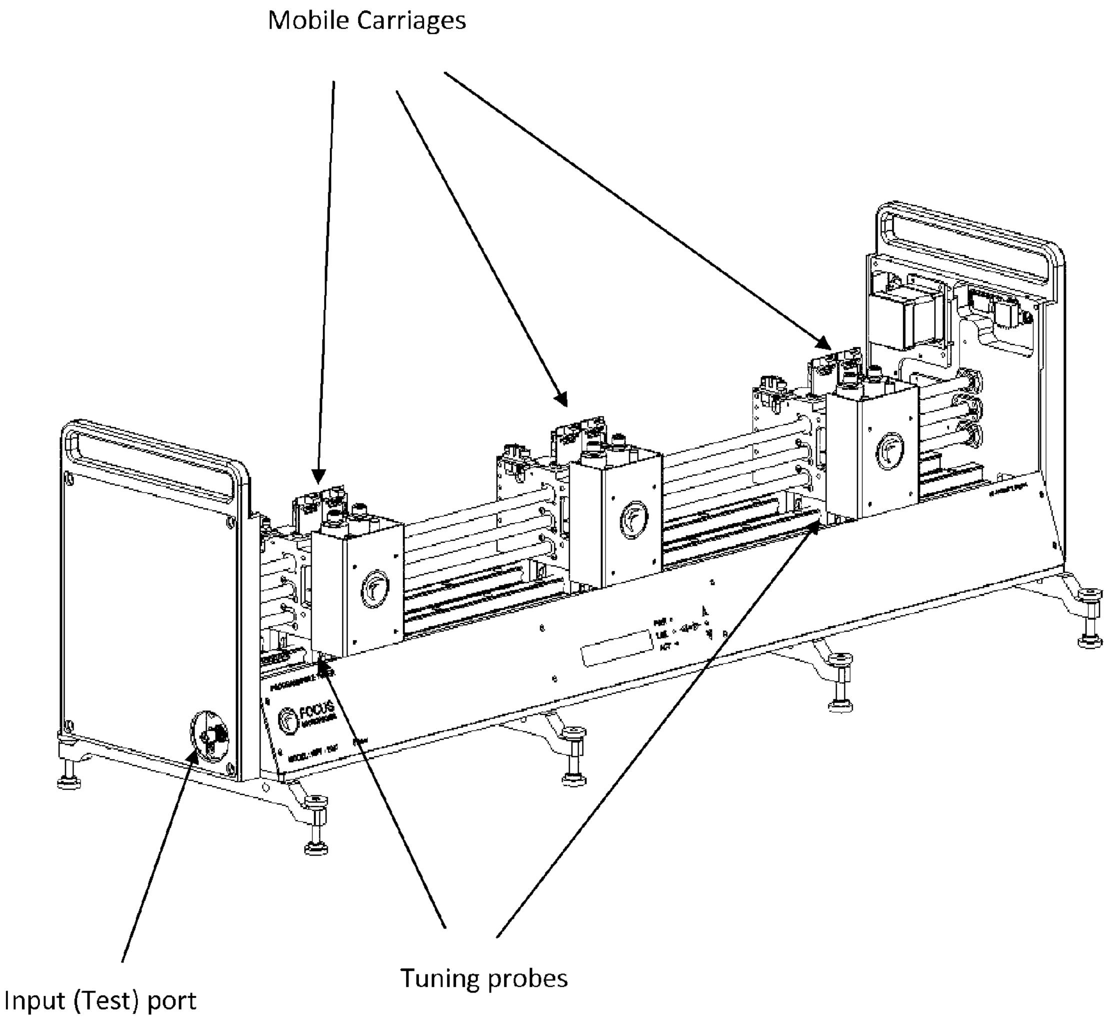
Figure 3: (prior art) actual three carriage (linear) harmonic tuner (Fmin=0.7GHz), total length 38" (96.5cm)

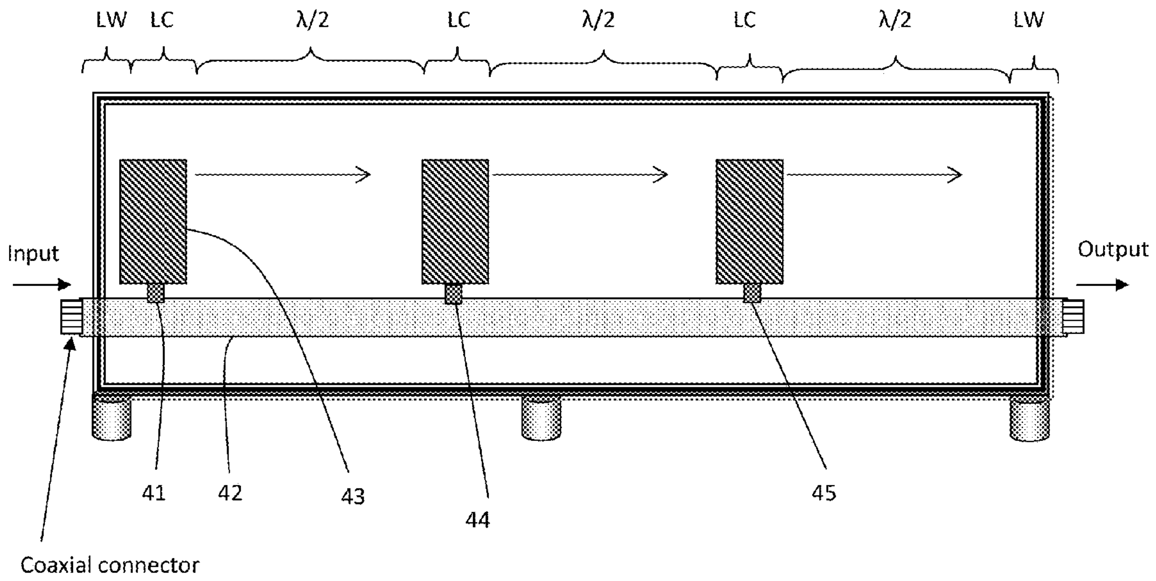
Figure 4 (prior art) Total length of three carriage tuner, LC=carriage, LW=wall

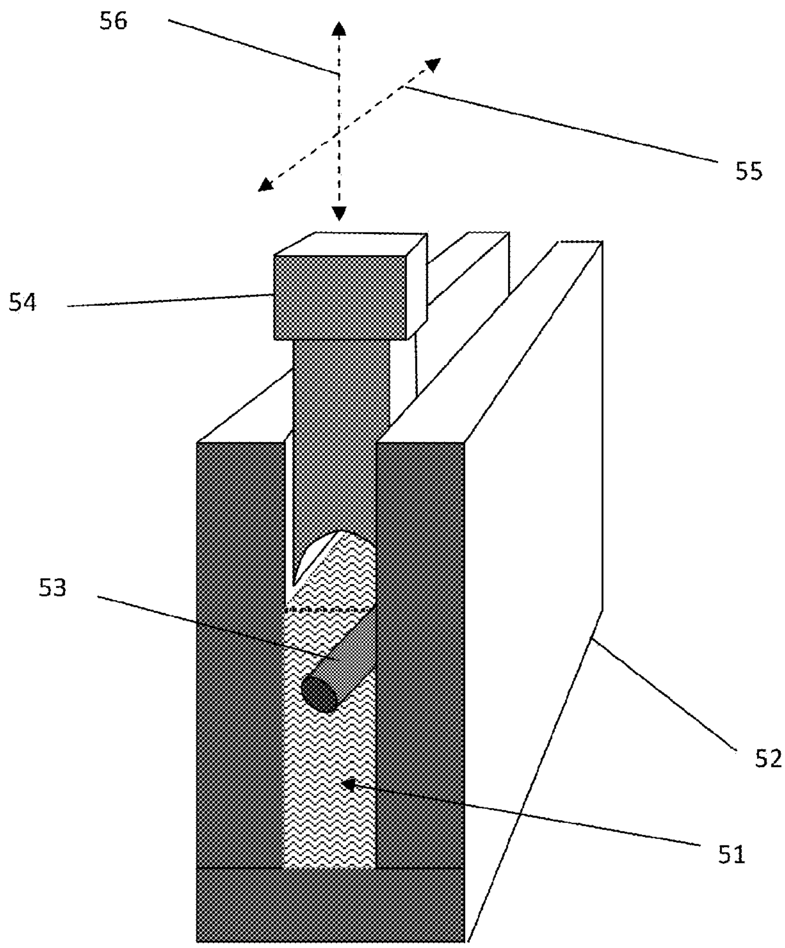
Figure 5: Slabline section filled with dielectric liquid

| | Epsilon | sqrt(epsilon) | tan delta | tan delta / sqrt(epsilon) |
|---|---|---|---|---|
| Teflon | 2.0 | 1.4 | .00028 | .000198 |
| Acetone | 23.0 | 4.8 | .05000 | .010426 |
| Water | 80.0 | 8.9 | .01000 | .001118 |
| Mineral oil | 2.2 | 1.5 | .00016 | .000108 |
| Silicon oil | 2.7 | 1.6 | .00010 | .000061 |
| Castor oil | 4.6 | 2.1 | .00100 | .000466 |
| ethanol | 25.8 | 5.1 | .05000 | .009844 |
| methanol | 32.0 | 5.7 | .90000 | .159099 |
| ester oil | 3.2 | 1.8 | .00015 | .000084 |
| air | 1.0 | 1.0 | .000000 | .000000 |

Figure 6 (prior art) summary of dielectric constant $\varepsilon_r$ and loss factor (tan delta) of various liquids

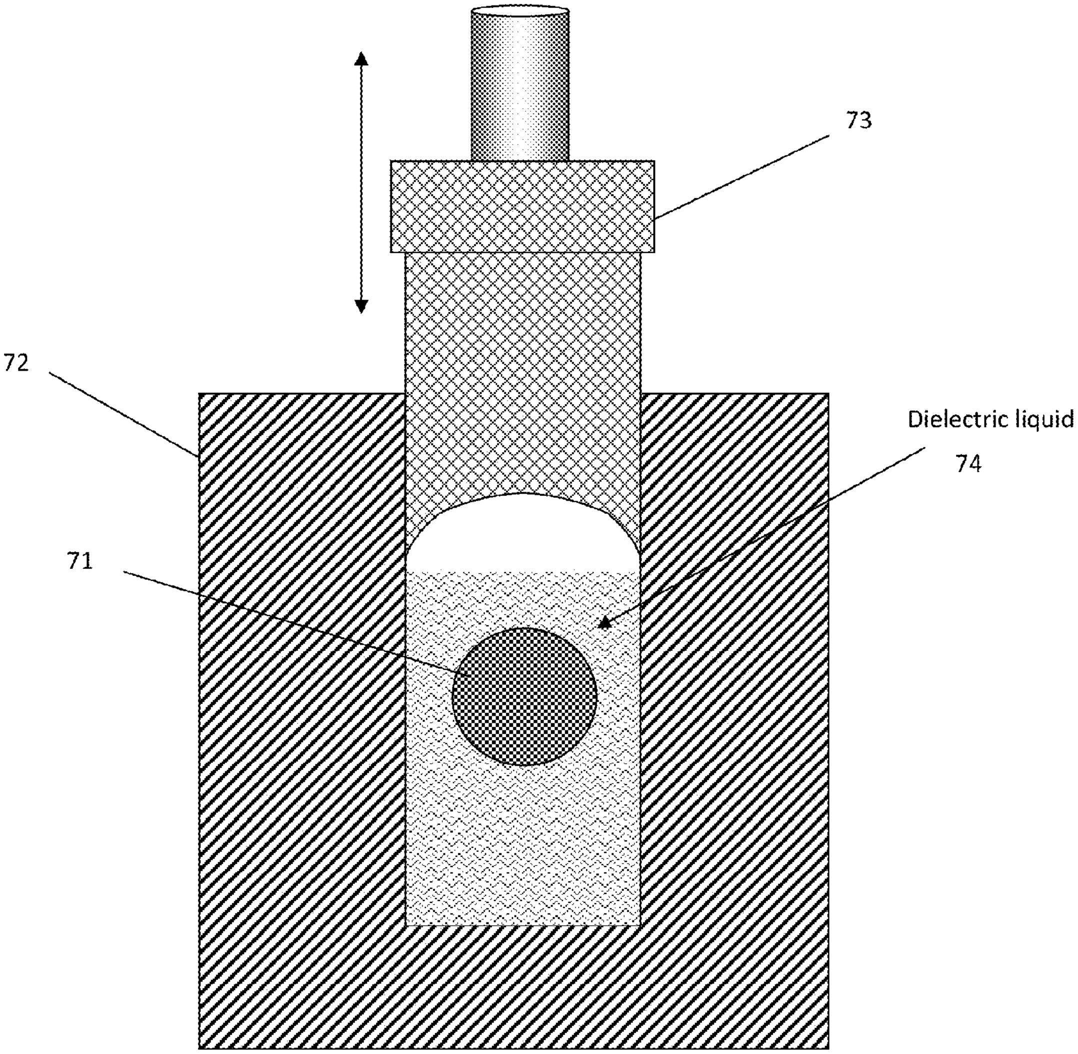
Figure 7: cross section of slabline filled with dielectric liquid and initialized probe

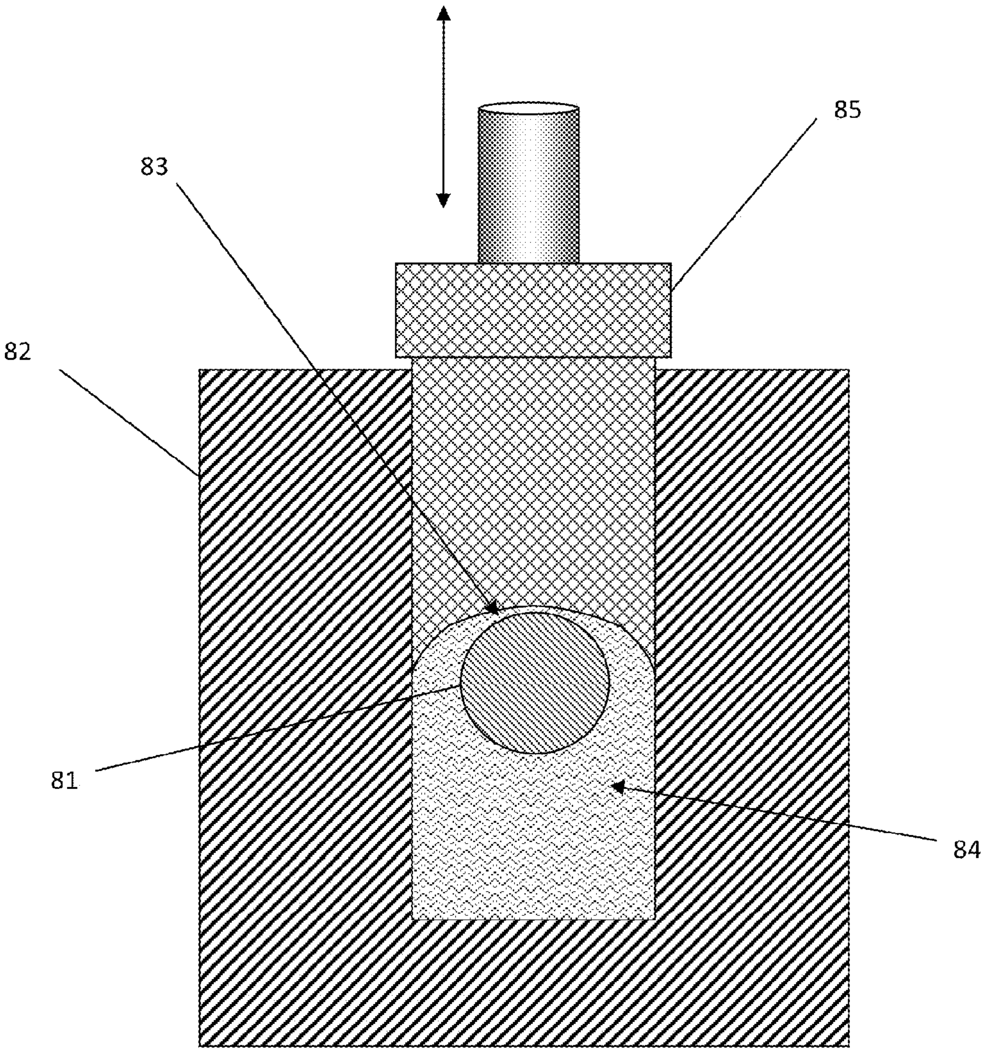
Figure 8: cross section of slabline filled with dielectric liquid and inserted probe

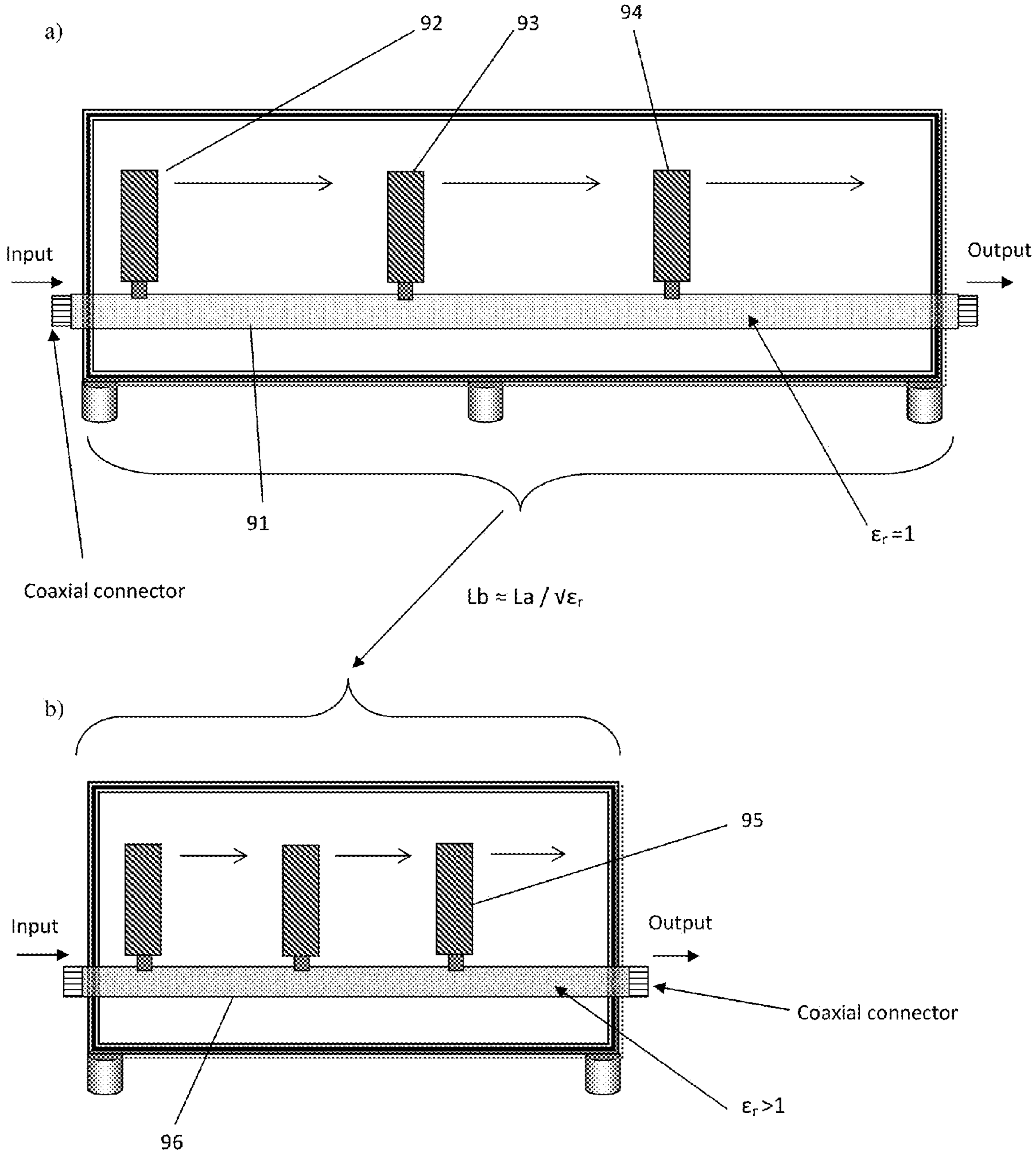
Figure 9: Reduction in tuner length by filling the slabline with dielectric liquid

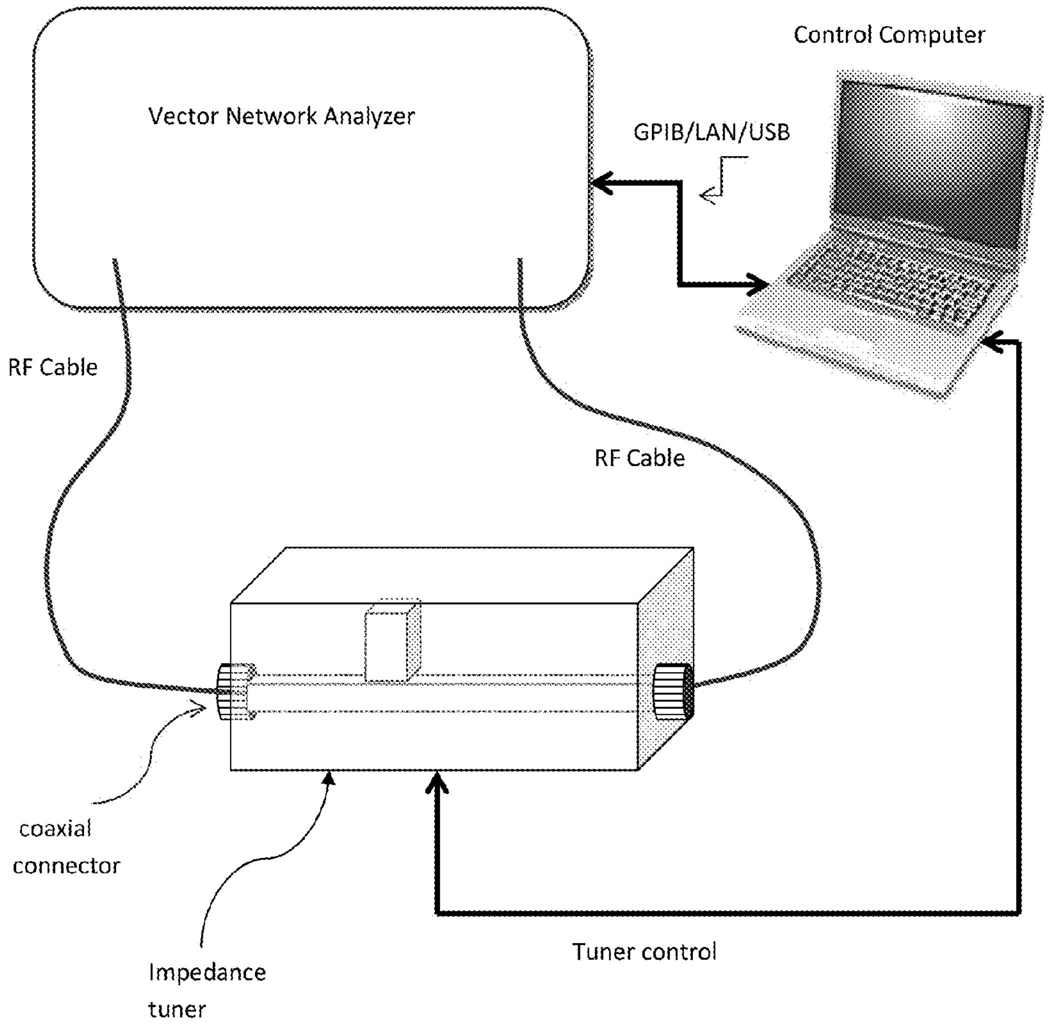
Figure 10: Tuner Calibration setup

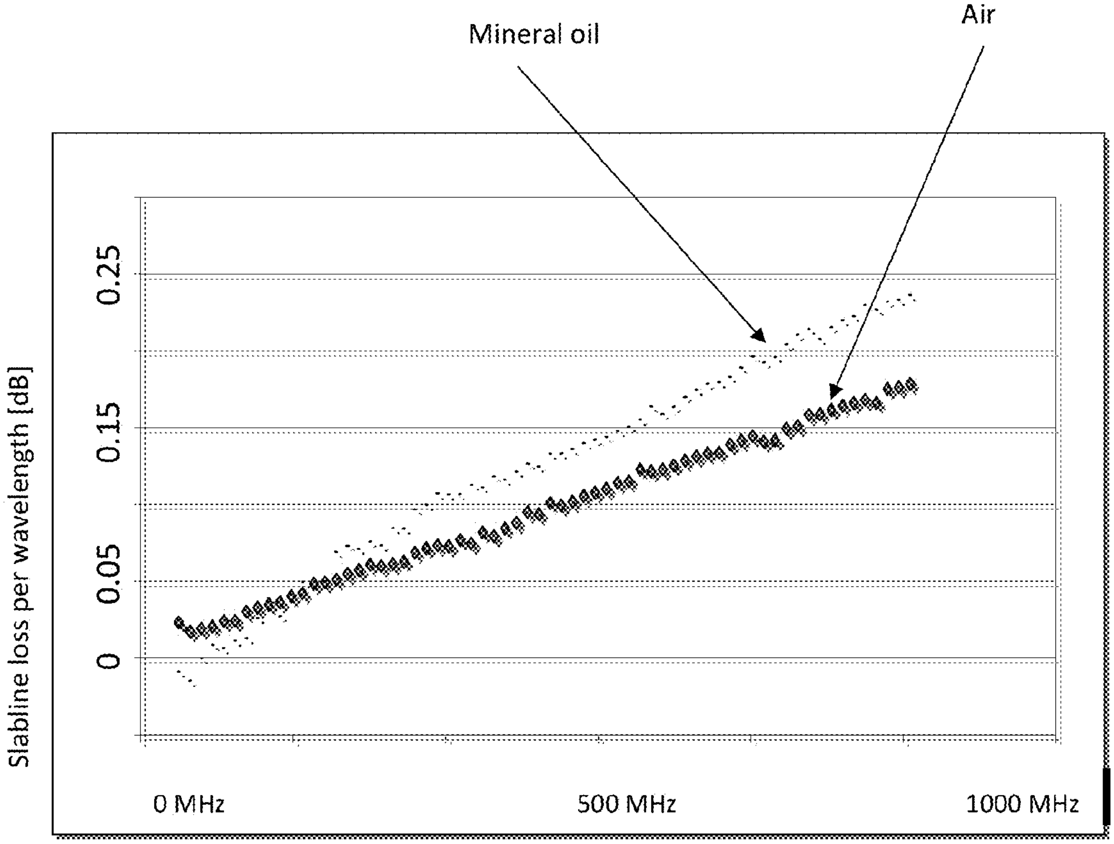
Figure 11: Comparison of tuner loss: mineral oil versus air (relative)

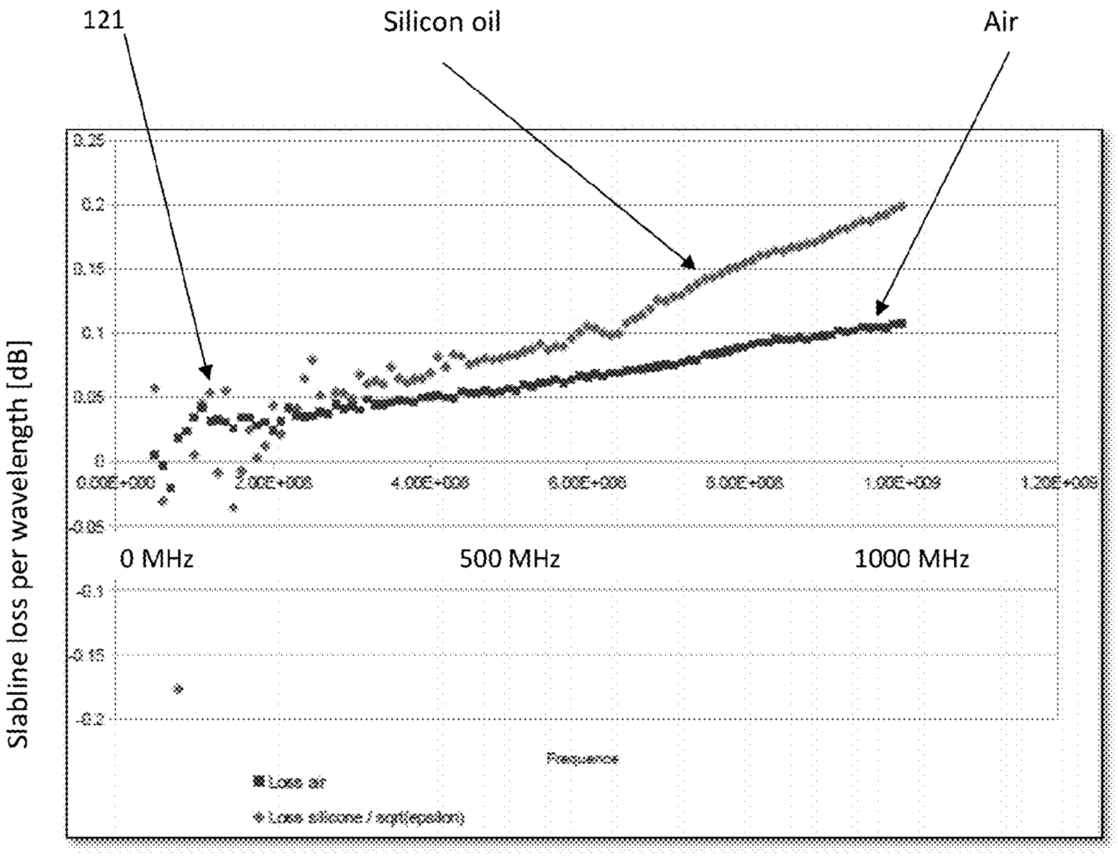
Figure 12: Comparison of tuner loss: silicon oil versus air (relative)

IMPEDANCE TUNER USING DIELECTRICALLY FILLED AIRLINE

PRIORITY CLAIM

Not applicable

CROSS-REFERENCE TO RELATED ARTICLES

[1] Load Pull System: http://www.microwaves101.com/encyclopedia/loadpull.cfm

[2] "Computer Controlled Microwave Tuner—CCMT," Product Note 41, Focus Microwaves, January 1998

[3] Directional Couplers: http://www.e-meca.com/rf-directional-coupler/directional-coupler-780.php

[4] U.S. Pat. No. 7,135,941, Triple probe automatic slide screw load pull tuner and method

[5] "MPT, a universal Multi-Purpose Tuner," Product Note 79, Focus Microwaves, October 2004.

[6] "On wafer Load Pull Tuner Setups: A design help", Application Note 48, Focus Microwaves, December 2001.

[7] U.S. Pat. No. 6,674,293, Adaptable pre-matched tuner system and method

[8] S-parameter Basics: http://www.microwaves101.com/encyclopedia/sparameters.cfm

BACKGROUND OF THE INVENTION

Prior Art

This invention relates to low noise and high power (nonlinear) testing of microwave transistors (DUT) in the frequency and time domain for Noise and_Load Pull measurements [1].

Microwave tuners [2], are used to test electrical components, like transistors, in cellular telephones and other electronic products to optimize performance. A microwave tuner helps determine the best circuit environment for optimal performance based on an electrical quantity called "impedance". Tuners can create a wide range of impedances to allow testing at different impedances. In the case of noise measurements the tuners are used to generate arbitrary source impedances and appropriate software is then used to extract the noise parameters. Impedances (Z) are related to reflection factors (Γ) through the relation:

$\Gamma=(Z-Zo)/(Z+Zo)$, whereby Zo is the characteristic impedance of the transmission line of the test system.

Load pull is the method by which the load impedance presented to the DUT at a given frequency is changed systematically and the DUT performance is registered, with the objective to find an optimum depending on the overall design objectives. This may be maximum power, efficiency, linearity or else. The same is valid for the source side of the DUT. Passive (slide screw) tuners are used to emulate the various impedances presented to the DUT [2], (FIG. 1). The electrical signals injected into the input of the DUT and extracted from the output can be measured using power meters directly or through sampling devices, typically signal directional couplers [3]. At high power the (nonlinear) DUT is saturating and deforming the sinusoidal input signal. As a result part of the power is contained in harmonic frequency components. The DUT performance can only be optimized when all harmonic frequency components are impedance-matched properly. This requires independent harmonic tuning, mainly at the DUT output, but often also at the DUT input.

A wideband slide screw tuner (FIG. 2) uses a slotted airline (slabline) (25) and a mobile carriage (23) which slides along the slabline and carries a metallic probe (21, 24), which is insertable into the slot of the slabline. By approaching to the center conductor (27) the probe creates controllable capacitive coupling between the center conductor and the ground walls of the slabline and thus a controllable reflection factor (FIG. 2*b*). To cover 360 degrees of reflection factor the carriage (and the probe) must travel at least one half of a wavelength along the slabline (22) (FIG. 2*a*).

Harmonic impedance tuners have been introduced in 2004 (FIGS. 3 and 4) [4]. They comprise a number of independent wideband probes (41, 44 and 45) attached to mobile carriages (43) and insertable into and movable horizontally inside the slot of a low loss transmission airline (slabline) (42). To tune independently three frequencies, harmonic or not, it has been shown experimentally, that there is need for three such probes (41, 44 and 45) [5]. Each probe is attached to and positioned by a precision remotely controlled gear mechanism in a carriage (43) (FIGS. 2, 3) and must travel one half a wavelength (λ/2) along the axis of the slabline. A three-frequency harmonic tuner is therefore at least three times longer than a wideband tuner with the same lowest frequency of operation.

The main shortcoming of such tuners [5] is their horizontal size and weight due to the length of the slabline. Since in order to generate arbitrary reflection factors (impedances) at any frequency, each probe and associated carriage must move horizontally over at least one half of a wavelength (λ/2) at the fundamental frequency Fo (FIG. 4) this means that the lowest fundamental frequency determines the length of the tuner.

The electrical wave length in air is λ [cm]=30/Frequency [GHz].

In a practical tuner apparatus (FIGS. 2*a*, 4) the size of the additional supporting items, a) the length of the mobile carriages themselves (LC) and b) the length of the side-walls (LW) of the tuner housing, add to the overall tuner length. In practical terms the minimum overall length of the slabline of a three carriage harmonic tuner, without the size of the input and output connectors, is: L=3*λ/2+3*carriage(LC)+2*sidewalls(LW) (FIG. 4).

The present invention describes a method allowing reducing the overall linear length of such a tuner, with minimal effect on its RF performance, by reducing the electrical wavelength inside the slabline; this is done by filling part of the slabline with a dielectric material with a dielectric coefficient $\epsilon_r>1$. The method consists therefore in a compromise between best RF performance and smallest mechanical size and weight.

BRIEF DESCRIPTION OF THE DRAWINGS

The invention and its mode of operation will be better understood from the following detailed description when read when read with the appended drawings in which:

FIG. 1 depicts prior art, a typical load pull test setup using impedance tuners to test RF transistors.

FIG. 2 depicts prior art, a) schematics of a single carriage slide screw tuner and definitions of basic elements determining its length; b) a cross section of a slabline and the tuning probe.

FIG. 3 depicts prior art, a photograph of an actual three carriage harmonic tuner and its actual length with a lowest frequency of operation of 0.7 GHz (700 MHz).

FIG. 4 depicts prior art, a schematics of an actual three carriage harmonic tuner and the definitions of all components determining the total tuner length.

FIG. 5 depicts a perspective view and cross section of a tuner slabline filled with liquid dielectric material and the tuning probe partly inserted.

FIG. 6 depicts prior art, a comparative table of various dielectric liquids, together with their dielectric constant "epsilon", the loss tangent "delta" and the ratio "tan $\delta/\sqrt{\in_r}$", which is a representative quantity for tuner applications.

FIG. 7 depicts a cross section of a dielectric liquid filled tuner slabline and initialized tuning probe.

FIG. 8 depicts a cross section of a dielectric liquid filled tuner slabline and tuning probe inserted to maximum reflection.

FIG. 9 depicts schematics of a three carriage tuner a) with air filled slabline and b) with dielectric filled slabline and the associated reduction in length.

FIG. 10 depicts a tuner calibration setup.

FIG. 11 depicts a comparison of measured slabline loss between a slabline filled with air and one filled with Mineral oil between 0 and 1000 MHz. The curves are normalized to the electrical wavelength.

FIG. 12 depicts a comparison of measured slabline loss between a slabline filled with air and one filled with Silicon oil between 0 and 1000 MHz. The curves are normalized to the electrical wavelength.

DETAILED DESCRIPTION OF THE INVENTION

The invention discloses the concept of reducing the length of single or multi-carriage impedance tuners, by using a low loss dielectric material to fill the slabline cavity and reduce the effective wavelength of the signals transmitted through the tuner, and thus the overall length of the slabline itself. In a preferred embodiment said dielectric material shall be a fluid, wherein oil is a preferred embodiment. FIG. 6 contains a comparative table of dielectric constants ($\in_r$) and associated loss (tan $\delta$) of various liquids. A high dielectric constant $\in_r$ is obviously preferable since the effective electric wavelength is $\lambda_{eff}=\lambda o/\sqrt{\in_r}$, whereby $\lambda o$ is the wavelength in air (or vacuum). However, as can be seen from FIG. 6, liquids with high $\in_r$ tend to have high losses (tan $\delta$). In the case of tuners losses are very important, since they reduce the effective tuning range, by twice the insertion loss between the tuner test port (FIG. 3) and the tuning probe and the loss between said tuning probes in case of a multi-probe tuner. An effective "figure of merit" is then the ratio between loss and dielectric constant, included in FIG. 6 in the column (tan $\delta/\sqrt{\in_r}$). The smaller this number for comparable dielectric constants, the better the specific dielectric fluid will be suited for tuner applications. Of course $\in_r$ has to be high enough to cause a significant reduction in tuner length, this reduction being approximately "$1/\sqrt{\in_r}$" (FIGS. 9*a*, 9*b*).

Considering two examples: a) a single carriage tuner starting at Fmin=200 MHz. The effective length of such an apparatus is actually 80 cm (75 cm free travel=$\lambda/2$ (200 MHz) plus 3 cm for the carriage and 2 cm for the two walls). Using a dielectric fluid with $\in_r=3$, the total length is reduced to 48.5 cm. b) In the case of a three carriage (harmonic) tuner starting at Fmin=400 MHz the associated dimensions are: b1) in air: 123.5 cm, b2) with dielectric: 76 cm. The size and weight reduction of roughly 40% in both cases is considerable and leads to reducing manufacturing cost and, most importantly, mounting effort and operation stability when tests are to be carried through on wafer [6].

Using dielectric fluid for filling the slabline offers a number of additional benefits: a) lubrication: the probes can slide effortlessly on the side-walls of the slabline for perfect grounding contact without any wear out; b) higher capacitance: the maximum capacitance reached between the probe approaching the center conductor is increased by the factor $\in_r$ for the same gap size (83); this increases the achievable reflection factor at the probe reference plane; c) reduction of electric field: the electric field E between (grounded) probe and center conductor is reduced: the voltage V between center conductor and probe is: $V=\in_r*E*S$, whereby "S" is the gap between center conductor and probe (83); or $E=V/(\in_r*S)$: i.e. the electric field across the gap is reduced by a factor $1/\in_r$, which automatically reduces the risk of Corona discharge; and finally d) provides better cooling of the center conductor: filling the cavity of the slabline with a liquid provides for better heat removal (cooling) of the center conductor, which in normal, air filled slabline tuners, is thermally insulated from the environment and heats up easily at high transmitted power.

The effect of using dielectrically filled slablines is shown in FIG. 9; each carriage only needs to travel ($1/\sqrt{\in_r}$) far, and for low enough minimum frequencies, this corresponds to the same reduction in overall tuner length, since the width of the carriages and tuner walls are small compared with $\lambda/2$.

In order to be used in automatic measurements an impedance tuner has to be automated and calibrated: automation means that the carriages and probes must be attached to and driven by gear mechanisms which will be controlled by electrical motors, preferably stepper motors [2, 7] and controlled by a central or on-board processor; calibration is necessary in order to be able to extract the DUT data from the measurement setup (FIG. 1).

A tuner calibration setup is shown in FIG. 10; a control computer communicates with a pre-calibrated network analyzer (VNA) which is connected through its test ports to the tuner two-port using high quality RF cables; an appropriate algorithm determines the horizontal and vertical probe positions (in stepper motor steps) needed to create a plurality of reflection factors (impedances) covering the tuning area of interest. Typically such area is the whole Smith chart, since it is often not known ahead of time where the optimum conditions for testing a DUT are; therefore the free horizontal travel for the carriage has to be at least one half of a wavelength at the test frequency; this corresponds to a 360 degree circle on the Smith chart. The S-parameters [8] of the tuner two-port measured by the VNA for said probe positions are retrieved by the computer via digital communication (USB, GPIB or LAN) and saved in calibration files in a format which associates S-parameters with probe positions. After the calibration the data are retrieved by the measurement routines, embedded with the test fixture parameters, in which the DUT is mounted, and applied as corrections to the data measured in the test setup (FIG. 1), in order to generate corrected measurement data referred to the DUT itself (phase and amplitude corrections of the reflection factor and amplitude corrections of input and output power etc. [1]).

This invention discloses a method for mechanically shortening single and multi-carriage tuners using a slabline filled with dielectric material; in a preferred embodiment said dielectric material is low loss silicon or mineral oil, but alternative substances are easily imaginable. Obvious alternatives of low loss high dielectric fluids shall not impede on the validity of the disclosed invention.

What I claim is:

1. A method for reducing the length of slide-screw impedance tuners using slotted airlines (slablines) filled with dielectric material, whereby said tuner comprises an input (test) port and an output (idle) port and has coaxial connectors attached to said ports, and a slotted airline (slabline) between said ports, and at least one mobile carriage travelling in parallel to the axis of said slabline, said carriage(s) carrying metallic tuning probes capacitively coupled to the center conductor of said slabline, said probes being insertable into the slot of said slabline and positioned at various distances from said center conductor and from said tuner test port, whereby creating adjustable reflection factors, said slabline being filled with dielectric material other than air.

2. A tuner as in claim 1, whereby said dielectric material is a low loss high dielectric liquid.

3. A slabline for slide screw tuner as in claim 1, whereby the diameter of the center conductor remains the same inside the slabline as in the connector, and whereby the width of the slabline channel is increased by an amount necessary to compensate for changes in the characteristic impedance Zo (=50Ω).

4. A tuner as in claim 1, whereby said mobile carriages and tuning probes are positioned by mechanical gear driven by electrical stepper motors and associated motor control circuitry.

5. A tuner as in claim 4, whereby said electrical motors and mechanical gear, positioning said carriages and probes, are remotely controlled by a computer running appropriate control software.

6. A calibration method for a tuner as in claim 5, whereby said tuner has one carriage, said carriage carrying at least one probe, said probe covering a selected frequency range of operation, in following steps:

a) connect said tuner to a pre-calibrated network analyzer being in operational communication with said control computer, b) set the tuner probe to a plurality of pre-determined horizontal and vertical positions, measure S-parameters of the tuner two-port at a given frequency and save in a calibration file ready for retrieval.

7. A calibration method for a tuner as in claim 5, whereby said tuner has two independently movable carriages, each said carriage carrying at least one probe, said probe covering a selected frequency range of operation, in following steps:

a) select one probe per carriage, probe 1 being associated with the carriage closest to the test port and probe 2 with the carriage closest to the idle port, b) connect said tuner to a pre-calibrated network analyzer being in operational communication with said control computer, c) withdraw all tuner probes from the slabline (initialize) and measure S-parameters of the tuner two-port at a given frequency, saving in file {S0}, d) set the tuner probe 1 to a plurality of pre-determined horizontal and vertical positions, leaving probe 2 initialized, and measure S-parameters of the tuner two-port for said probe 1 positions and save in a file {S1}, e) initialize probe 1, f) set the tuner probe 2 to a plurality of pre-determined horizontal and vertical positions, leaving probe 1 initialized, and measure S-parameters of the tuner two-port for said probe 2 positions, g) cascade the inverse matrix $\{S0\}^{-1}$ with the S-parameters measured in step (f) and save in file {S2}, h) cascade S-parameters in files {S1} and {S2} for all probe settings and save in a two-carriage tuner calibration file ready for retrieval.

8. A calibration method for a tuner as in claim 5, whereby said tuner has three independently movable carriages, each said carriage carrying at least one probe, said probe covering a selected frequency range of operation, in following steps:

a) select one probe per carriage, probe 1 being associated with the carriage closest to the test port and probe 3 with the carriage closest to the idle port, b) connect said tuner to a pre-calibrated network analyzer being in operational communication with said control computer, c) withdraw all tuner probes from the slabline (initialize) and measure S-parameters of the tuner two-port at a given frequency, saving in file {S0}, d) set the tuner probe 1 to a plurality of pre-determined horizontal and vertical positions, leaving all other probes initialized, and measure S-parameters of the tuner two-port for said probe 1 positions and save in a file {S1}, e) initialize probe 1, f) set the tuner probe 2 to a plurality of pre-determined horizontal and vertical positions, leaving all other probes initialized, and measure S-parameters of the tuner two-port for said probe 2 positions, g) cascade the S-parameters measured in step (f) with the inverse matrix $\{S0\}^{-1}$ and save in file {S2}, h) initialize probe 2, i) set the tuner probe 3 to a plurality of pre-determined horizontal and vertical positions leaving all other probes initialized, and measure S-parameters of the tuner two-port for said probe 3 positions, j) cascade the inverse matrix $\{S0\}^{-1}$ with the S-parameters measured in step (i) and save in file {S3}, k) cascade S-parameters in files {S1}, {S2} and {S3} for all probe settings and save in a three-carriage tuner calibration file ready for retrieval.

* * * * *